(12) United States Patent
Perssson

(10) Patent No.: US 6,207,912 B1
(45) Date of Patent: Mar. 27, 2001

(54) ELECTROSTATIC DISCHARGE PROTECTION IN A PORTABLE COMMUNICATION DEVICE

(75) Inventor: Göran Persson, Malmö (SE)

(73) Assignee: Telefonaktiebolaget LM Ericsson, Stockholm (SE)

( * ) Notice: Subject to any disclaimer, the term of this patent is extended or adjusted under 35 U.S.C. 154(b) by 0 days.

(21) Appl. No.: 09/032,794

(22) Filed: Mar. 2, 1998

(30) Foreign Application Priority Data

Mar. 3, 1997 (SE) .................................................. 9700736

(51) Int. Cl.$^7$ ...................................................... H01H 9/12
(52) U.S. Cl. ............................................. 200/305; 200/512
(58) Field of Search ................................. 200/305, 306, 200/5 A, 512

(56) References Cited

U.S. PATENT DOCUMENTS

| | | | |
|---|---|---|---|
| 4,524,249 | * | 6/1985 | Farrell .................................. 200/5 A |
| 4,636,593 | * | 1/1987 | Novak et al. ......................... 200/5 A |
| 4,678,880 | * | 7/1987 | Loizumi et al. ................. 200/305 X |
| 4,809,126 | | 2/1989 | Burkman et al. . |
| 4,916,262 | * | 4/1990 | Jungels-Butler et al. ........... 200/5 A |
| 5,063,474 | | 11/1991 | Igarashi . |
| 5,335,137 | | 8/1994 | English et al. . |
| 5,513,078 | * | 4/1996 | Komrska et al. ................. 200/305 X |
| 5,557,079 | * | 9/1996 | Jackson et al. .................. 200/305 X |
| 5,661,279 | * | 8/1997 | Kenmochi ........................ 200/305 X |

FOREIGN PATENT DOCUMENTS

| | | |
|---|---|---|
| 0 302 350 | 7/1988 | (EP) . |
| 0 358 885 | 7/1989 | (EP) . |
| 0 367 530 | 10/1989 | (EP) . |
| 0 703 591 | 7/1995 | (EP) . |

* cited by examiner

*Primary Examiner*—Renee Luebke
(74) *Attorney, Agent, or Firm*—Burns, Doane, Swecker & Mathis, L.L.P.

(57) ABSTRACT

A portable communication device has an electronic circuit board arranged inside a housing, and a keypad, the individual keys of which are arranged, when depressed, to collapse a respective tactile dome on a domefoil interposed between the keypad and the circuit board, so as to establish electric contact with a respective contact point on the circuit board. The domefoil is formed as a non-conductive sheet providing an airtight and/or electrostatic seal between the keypad and the circuit board. The domefoil protects the circuit board from electrostatic discharge.

4 Claims, 3 Drawing Sheets

ELECTROSTATIC DISCHARGE PROTECTION IN A PORTABLE COMMUNICATION DEVICE

The present invention relates to a portable communication device, comprising an electronic circuit board arranged inside a housing, and a keypad, the individual keys of which are arranged, when depressed, to collapse a respective tactile dome on a domefoil interposed between the keypad and the circuit board, so as to establish electric contact with a respective contact point on the circuit board, said communication device being provided with means for protecting the circuit board from electrostatic discharge (ESD).

BACKGROUND

Portable communication devices are used in various applications to provide a means for remote communication between two parties. Common communication devices of this kind are for instance cellular telephones, cordless phones, paging devices, walkie-talkies, PDAs (Personal Digital Assistants), etc. Such devices comprise an apparatus housing, in which an electronic circuit board is arranged. The circuit board is provided with circuitry necessary for performing the operational communication tasks of the device, e.g. CPU, memory modules and radio circuits (amplifiers, local oscillators, filters, modulators, mixers, etc). Furthermore, the circuit board is often provided with LEDs (Light Emitting Diodes) or other devices for illuminating a keypad arranged in the housing.

Keypad-operated devices of the kind described above have to fulfill various requirements in order to provide a reliable communication service to the user of the device. Such requirements are for instance immunity to electrostatic discharge (ESD) as well as a sufficiently high degree of electromagnetic compatibility (EMC). When the user touches the keypad, there is an apparent risk of an electrostatic discharge between the user's fingertip and conductive elements, e.g. the electronic circuit board inside the device, and hence a keypad-operated communication device must be provided with ESD-protective means. Furthermore, the device must be shielded in a way that prevents the active parts of the communication device from interfering electromagnetically with surrounding electronic equipment. Such shielding must also protect the device from electromagnetic influences or disturbances caused by such surrounding electronic equipment.

FIG. 2 discloses a previously known keypad arrangement for a cellular telephone. A keypad 30 is made from e.g. rubber and comprises a set of individual keys 32. Although not shown in the drawing each key 32 is labelled according to its dedicated purpose, for instance a digit "3" or a "*" sign. A domefoil 40 made from plastics or the like is interposed between the keypad 30 and an electronic circuit board 20 arranged inside the telephone housing. The domefoil 40 is provided with a plurality of tactile domes 42, each of which is given a convex shape protruding or bulging from the domefoil 40. One respective dome 42 is arranged beneath one respective key 32 in the keypad 30.

The circuit board 20 is given a purely schematical appearance in FIG. 2. The circuit board 20 comprises various electronic circuitry, such as radio transmitter/receiver circuits, amplifiers, filters, buffers, oscillators, mixers, one or several micro-processors, memory modules, etc., none of which are indicated in FIG. 2. Furthermore, the circuit board 20 is provided with a set of contact points 22, a respective one of which being arranged in vertical alignment with a respective pair of key 32 and dome 42.

The functional operation of the keypad 30 is as follows. When a key 32 is depressed by a user, the back of the key will exert a force upon the underlying tactile dome 42. The dome 42 will not be able to resist the force exerted by the key 32 but will collapse inwardly/downwardly and reach contact with the underlying contact point 22. For this purpose the rear side of each dome 42 is made electrically conductive, for instance by providing each dome with a conductive layer, such as a silver or carbon compound. The collapsing dome establishes electric contact between a contact pair at the contact point 22, the details of which are omitted in the drawing, since they are believed to be well-known per se to a man skilled in the art. The electric connection so established is immediately detected by a controller comprised on the circuit board.

Furthermore, the circuit board 20 is provided with illuminating means 24 realized as LEDs (Light Emitting Diodes), the purpose of which is to illuminate the keys 32 through respective openings 44 in the domefoil 40. In FIG. 2 one illuminating means 24 is arranged to illuminate four keys 32 surrounding the opening 44. In addition to these openings the domefoil 40 is provided with various holes, openings or recesses 46, 48, 49 for various electronic components or mounting means arranged on the circuit board 20.

In the prior art arrangement according to FIG. 2 the rubber-based keypad sheet 32 serves as an ESD-protective means. Furthermore, the housing 12 shown in FIG. 1 is provided on the inside thereof with a thin metallized layer functioning as a protection or a shielding against electromagnetic interference between the telephone 10 and surrounding electronic equipment. Although providing a sufficient protection against ESD as well as electromagnetic interference, the prior art arrangement according to FIG. 2 is disadvantageous when it comes to cost considerations. Both the keypad rubber sheet 30 and the metallized layer inside the housing 10 and a non-negligable price penalty to the total cost for manufacturing the telephone 10.

SUMMARY

It is an object of the present invention to provide a portable communication device with safe and inexpensive electrostatic discharge protection A further object of some embodiments is to provide the communication device with means protecting the device from electrostatic discharge (ESD) as well as assuring electromagnetic compatibility (EMC).

The objects of the invention are achieved for a portable communication device of the kind described above by protecting the circuit board inside the communication device from electrostatic discharge by means of a domefoil formed as a non-conductive sheet providing an air-tight and/or electrostatic seal between the keypad and the circuit board

BRIEF DESCRIPTION OF THE DRAWINGS

Preferred embodiments of the invention will be described in more detail in the following, reference being made to the accompanying drawings, in which.

DETAILED DESCRIPTION

Figure 1:
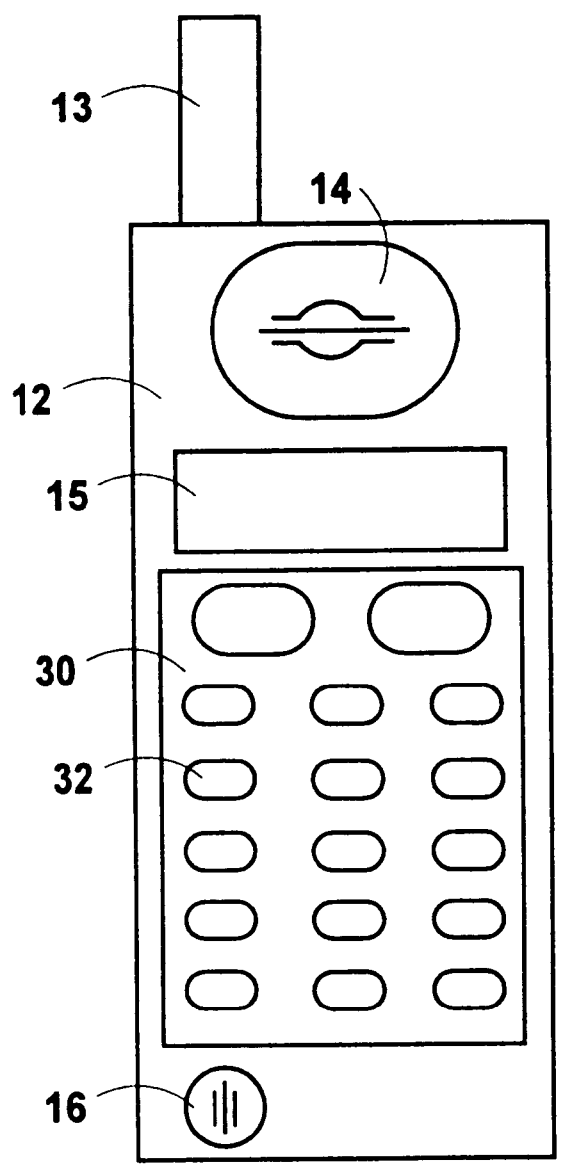
FIG. 1 is a schematic view of an exemplary cellular telephone, for which the invention may be applied.

In FIG. 1 there is shown an exemplary cellular telephone 10, comprising an apparatus housing 12, an antenna 13, a loudspeaker 14, a display 15, and a microphone 16. Furthermore, the cellular telephone 10 is provided with a keypad 30 for user communication. A user controls the operation of the cellular telephone by entering commands on the keypad 30, i.e. by depressing an appropriate individual key 32 among the set of keys in the keypad 30. Preferably, the keypad comprises a set of alphanumeric keys labelled "0" through "9", as well as control keys such as "*" and "#", an "Answer" or "YES" key, a "Hangup" or "NO" key, volume control keys, etc. From an overall point of view according to FIG. 1 the cellular telephone 10 is well-known in all relevant aspects to a man skilled in the art, and hence no further description is made here.

Figure 2:
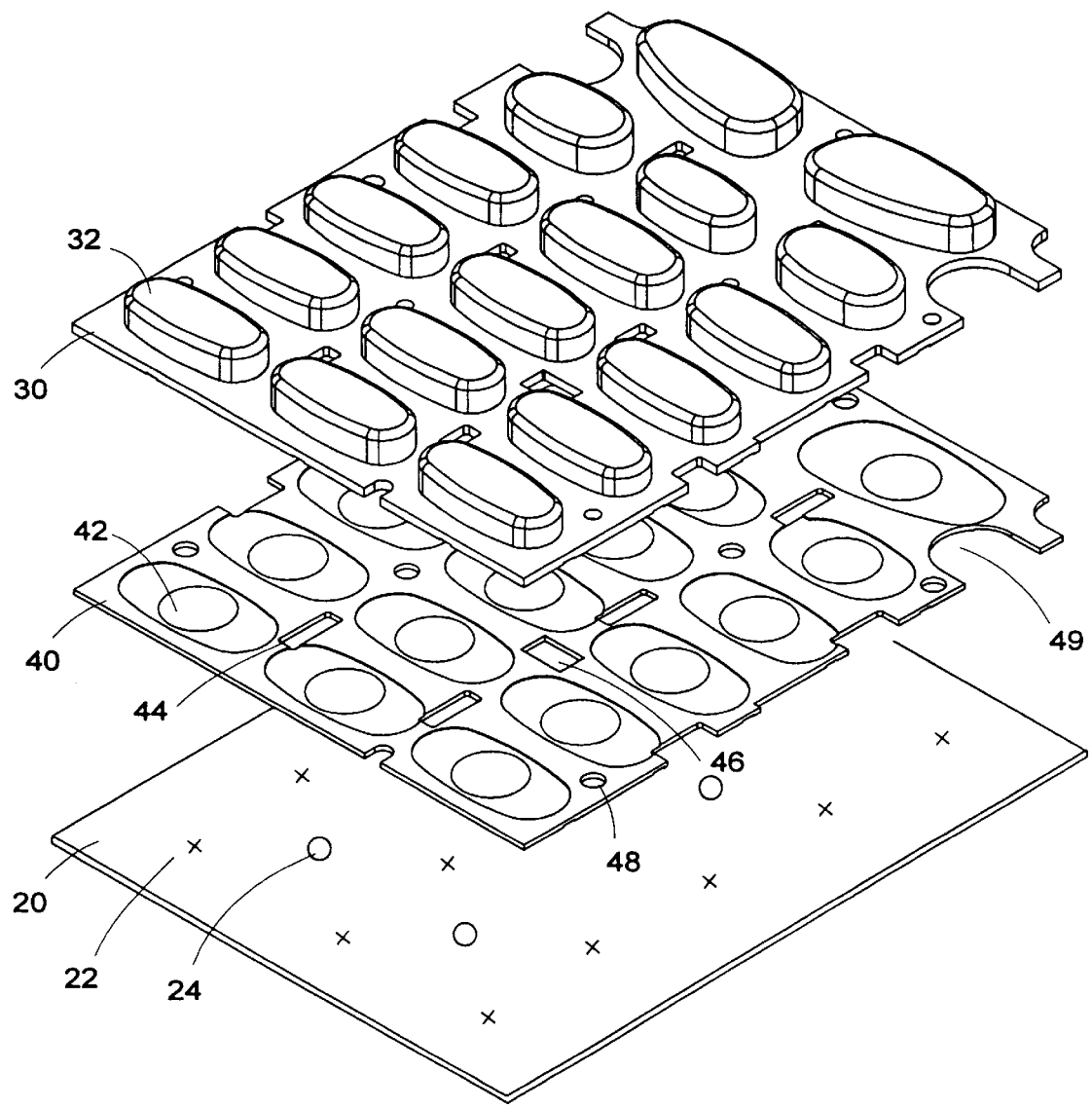
FIG. 2 is a schematic perspective view of a prior art keypad arrangement in a cellular telephone.
Figure 3:
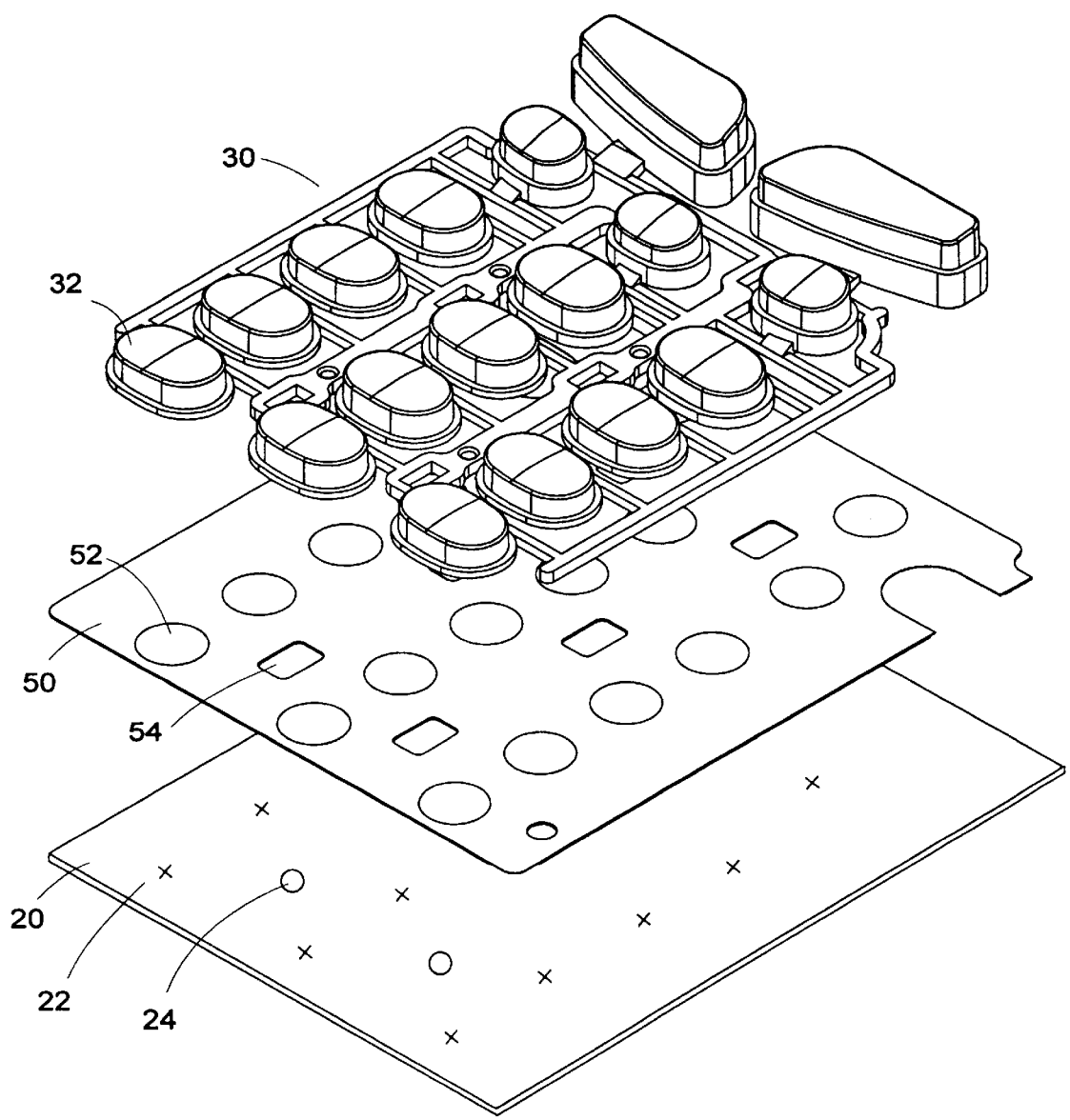
FIG. 3 is a schematic perspective view of a combined keypad and ESD-protective arrangement according to a preferred embodiment of the invention.

The inventive solution according to FIG. 3 proposes a less expensive way of providing the telephone with means for protection against ESD. According to the present invention the domefoil 50, with its set of tactile key domes 52, is formed as a sheet fully covering the entire surface between the keypad 30 and the underlying circuit board 20. At least the front surface of the domefoil 50 is made electrically non-conductive or isolating, thereby providing an airtight and/or electrostatic seal between the keypad and the circuit board and thus functioning as an ESD-protective means. In contrast to the prior art domefoil 40 in FIG. 2, the inventive domefoil 50 has no open-air openings which would permit an electric spark to be transferred from a key 32 to the circuit board 20. All previous openings, such as the openings for the illuminating means 24, are covered with additional domes 54 of a non-conductive material isolating the circuit board 20 from the keypad 30.

According to the preferred embodiment in FIG. 3 the keypad 30 is realized as a keytree made from plastics or the like. Such a keytree structure is previously known per se to be a very cheap way of realizing a keypad function in a communication device. Thanks to the integrated domefoil 50 there is no longer any need for the keypad 30 to be made from rubber or having to act as ESD-protection as well as a means for user interaction.

As mentioned above the domefoil 50 is provided with additional domes 54 for the underlying illuminating means 24 (which are realized as LEDs or similar components). Obviously the additional domes 54 must be made transparent or at least semi-transparent to the light emitted from the illuminating means 24. Preferably the additional domes 54 are made white or glossy so as to give a better illumination of the keypad 30. In an alternative embodiment the additional domes 54 could be printed with a certain screen or dot pattern to direct the light towards the four keys 32 surrounding the dome 54 and the underlying illuminating means 24. This pattern may exhibit lines or dots which are arranged at increasing size or density in the directions of the keys 32.

According to one embodiment of the invention the interior of the domefoil 50 is provided with a layer of electrically conductive material, such as a silver compound. The conductive layer is connected to a grounding means so as to function as a means for protection against electromagnetic interferences thereby assuring electromagnetic compatibility. Hence, the need for a metallized apparatus housing in the prior art arrangement according to FIG. 2 has been eliminated, and the domefoil will act as a combined means for protection against ESD as well as electromagnetic interference.

To help dissipating heat generated by the various circuits and components on the electronic circuit board 20 the domefoil 50 may be provided with air channels extending along a major part of the domefoil and reaching some of the edges of the domefoil 50.

The present invention has been described above with reference to a few embodiments or examples, but it is to be understood that the invention shall by no means be restricted to the specific embodiments disclosed in the foregoing. On the contrary, the present invention shall only be limited by the scope of the appended patent claims.

What is claimed is:

1. A portable communication device, comprising an electronic circuit board arranged inside a housing, and a keypad, individual keys of which are arranged, when depressed, to collapse a respective tactile dome on a domefoil interposed between the keypad and the circuit board, so as to establish electric contact with a respective contact point on the circuit board, wherein said domefoil is formed as a non-conductive sheet providing an electrostatic seal between the keypad and the circuit board, said domefoil thereby protecting the circuit board from electrostatic discharge (ESD); and an electrically conductive layer is provided in an interior of the domefoil and is connected to ground means, said layer thereby inhibiting electromagnetic interference between the device and its surroundings.

2. The communication device according to claim 1, wherein the device is a radio telephone.

3. The communication device according to claim 2, wherein the device is a cellular telephone.

4. A method of protecting a keypad-operated device from electrostatic discharge between a keypad and an electronic circuit board inside the device, comprising a step of providing the device with a domefoil, comprising a set of tactile domes and at least an entire front surface of which being made from an electrically isolating material, as an electrostatic seal between the keypad and the circuit board; and providing an interior of the domefoil with an electrically conductive and grounded layer, said layer acting as an electromagnetic shield between the circuit board and electronic equipment external to the device.

* * * * *